United States Patent
Lee

(10) Patent No.: US 9,590,596 B1
(45) Date of Patent: Mar. 7, 2017

(54) RECEIVING CIRCUIT, SEMICONDUCTOR APPARATUS AND SYSTEM USING THE SAME

(71) Applicant: SK hynix Inc., Icheon-si, Gyeonggi-do (KR)

(72) Inventor: Dong Uk Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/091,728

(22) Filed: Apr. 6, 2016

(30) Foreign Application Priority Data

Dec. 18, 2015 (KR) ........................ 10-2015-0181416

(51) Int. Cl.
*H03L 5/00* (2006.01)
*H03K 3/012* (2006.01)
*H03K 3/3562* (2006.01)

(52) U.S. Cl.
CPC ......... *H03K 3/012* (2013.01); *H03K 3/35625* (2013.01)

(58) Field of Classification Search
None
See application file for complete search history.

(56) References Cited

U.S. PATENT DOCUMENTS

| 5,469,116 | A  | * | 11/1995 | Slemmer | ............. | H03B 5/364 |
|-----------|----|---|---------|---------|---------------|------------|
|           |    |   |         |         |               | 326/93 |
| 7,612,615 | B1 |   | 11/2009 | Hou     |               |            |
| 9,118,317 | B2 | * | 8/2015  | Tian    | ............. | H03K 19/00384 |
| 2009/0261859 | A1 | * | 10/2009 | Hollis | ............. | H03K 19/00315 |
|           |    |   |         |         |               | 326/63 |
| 2015/0244954 | A1 | * | 8/2015 | Shin   | ............. | H04N 5/376 |
|           |    |   |         |         |               | 250/208.1 |

FOREIGN PATENT DOCUMENTS

KR          100801032 B1    1/2008

* cited by examiner

*Primary Examiner* — Cassandra Cox
(74) *Attorney, Agent, or Firm* — William Park & Associates Ltd.

(57) ABSTRACT

A receiving circuit may include a wide range receiving circuit and a parallelizing circuit. The wide range receiving circuit may amplify an input signal which swings within a first range and generate an intermediate output signal which swings within a second range wider than the first range. The parallelizing circuit may compare the intermediate output signal with a second reference voltage and amplify the intermediate output signal accordingly and generate output signals which swing within a third range wider than the second range.

19 Claims, 10 Drawing Sheets

RECEIVING CIRCUIT, SEMICONDUCTOR APPARATUS AND SYSTEM USING THE SAME

CROSS-REFERENCES TO RELATED APPLICATION

The present application claims priority under 35 U.S.C. §119(a) to Korean application number 10-2015-0181416 filed on Dec. 18, 2015, in the Korean Intellectual Property Office, which is incorporated herein by reference in its entirety.

BACKGROUND

1. Technical Field

Various embodiments generally relate to a semiconductor apparatus, and, more particularly, to a receiving circuit, a semiconductor apparatus and a system using the same.

2. Related Art

Electronic products that manipulate data (e.g., personal computer, tablet PC, laptop computer, and smart phone) may include various electronic components communicating with each other. Two different electronic components in the electronic products may transmit and receive electrical signals through high-speed communication mediums. For example, semiconductor apparatuses may include transmitting components and receiving components to exchange signals.

The semiconductor apparatuses may exchange signals through a signal transmission line such as a bus. Recently, a high-performance, low-power semiconductor apparatus that operates at a high speed is being developed. In order to reduce the power consumption, signal swing of the signal transmitted through the bus is kept sufficiently small. Therefore, there is a growing need for an improved receiver capable of precisely receiving a small signal transmitted through a signal transmission line.

SUMMARY

In an embodiment, a receiving device may include a wide range receiving circuit and a parallelizing circuit. The wide range receiving circuit may compare an input signal, which swings within a first range, with a first reference voltage and amplify the input signal accordingly, and generate an intermediate output signal which swings within a second range wider than the first range. The parallelizing circuit may compare the intermediate output signal with a second reference voltage and amplify the intermediate output signal accordingly, and generate output signals which swing within a third range wider than the second range.

In an embodiment, a receiving device may include a wide range differential receiving circuit and a parallelizing circuit. The wide range differential receiving circuit may compare an input signal, which swings within a first range, with a first reference voltage and amplify the input signal accordingly, and generate a first intermediate output signal and a second intermediate output signal which swing within a second range wider than the first range. The parallelizing circuit may compare and amplify the first and second intermediate output signals, and generate output signals which swing within a third range wider than the second range.

In an embodiment, a system may include a first semiconductor apparatus and a second semiconductor apparatus. The first semiconductor apparatus may transmit data signal through a data bus. The second semiconductor apparatus may include a receiving circuit which receives the data signal. The receiving device may include a wide range receiving circuit and a parallelizing circuit. The wide range receiving circuit may compare the data signal with a first reference voltage and amplify the data signal accordingly, and generate first and second intermediate output signals which swing between a first amplification voltage and a ground voltage. The parallelizing circuit may compare and amplify the first and second intermediate output signals, generate output signals which swing between a second amplification voltage having a level higher than the first amplification voltage and the ground voltage, and output the output signals in synchronization with a data strobe signal.

DETAILED DESCRIPTION

Hereinafter, a receiving circuit, a semiconductor apparatus and a system using the same will be described below with reference to the accompanying drawings through various examples of embodiments.

Figure 1:
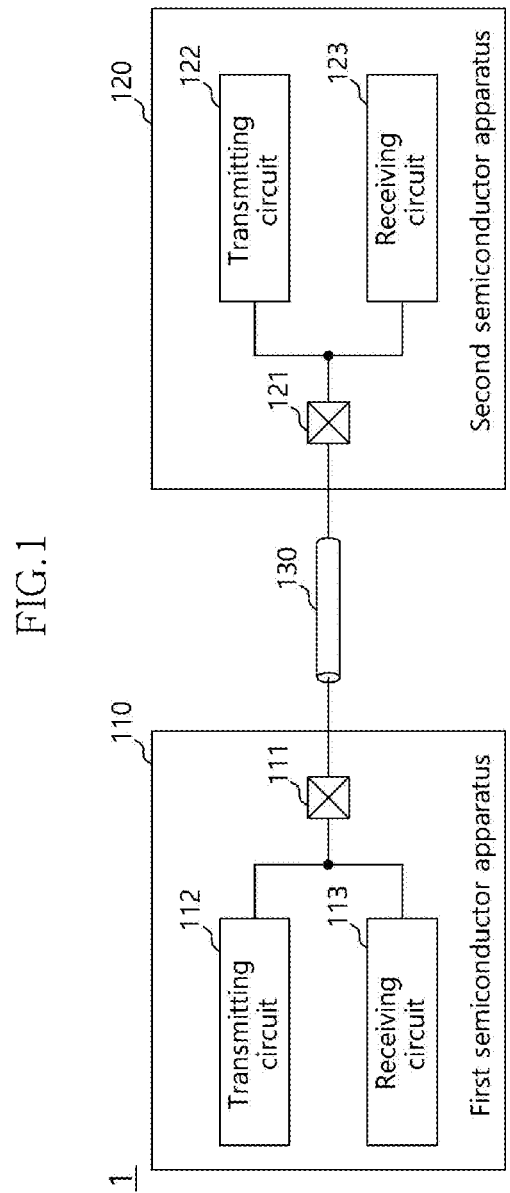
FIG. 1 is a diagram illustrating an example of a system in accordance with an embodiment.

In FIG. 1, a system 1 in accordance with an embodiment may include a first semiconductor apparatus 110 and a second semiconductor apparatus 120. The first semiconductor apparatus 110 and the second semiconductor apparatus 120 may communicate with each other. In an embodiment, the first semiconductor apparatus 110 may be a master device, and the second semiconductor apparatus 120 may be a slave device controlled by the first semiconductor apparatus 110. For example, the first semiconductor apparatus 110 may be a host, and the host may include a central processing unit (CPU), a graphic processing unit (GPU), a multimedia processor (MMP), a digital signal processor (DSP) or a memory controller. Also, the first semiconductor apparatus 110 may be realized in the form of a system-on-chip (SoC) by combining processor chips having various functions, such as application processors. The second semiconductor apparatus 120 may be a memory, and the memory may include a volatile memory or a nonvolatile memory.

The volatile memory may include a static RAM (SRAM), a dynamic RAM (DRAM), or a synchronous DRAM (SDRAM), and the nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), or a ferroelectric RAM (FRAM).

The first and second semiconductor apparatuses 110 and 120 may be coupled to each other through a signal transmission line 130. The first semiconductor apparatus 110 may include a pad 111, and the pad 111 may be coupled to the signal transmission line 130. The second semiconductor apparatus 120 may include a pad 121, and the pad 121 may be coupled to the signal transmission line 130. The signal transmission line 130 may be a channel, a link or a bus through which data may be transmitted. The first semiconductor apparatus 110 may include a transmitting circuit 112 and a receiving circuit 113. The transmitting circuit 112 may generate an output signal according to an internal signal of the first semiconductor apparatus 110, and transmit the output signal to the second semiconductor apparatus 120 through the signal transmission line 130. The receiving circuit 113 may receive a signal transmitted from the second semiconductor apparatus 120 through the signal transmission line 130, and generate an internal signal. Similarly, the second semiconductor apparatus 120 may include a transmitting circuit 122 and a receiving circuit 123. The transmitting circuit 122 may generate an output signal according to an internal signal of the second semiconductor apparatus 120, and transmit the output signal to the first semiconductor apparatus 110 through the signal transmission line 130. The receiving circuit 123 may receive a signal transmitted from the first semiconductor apparatus 110 through the signal transmission line 130, and generate an internal signal.

Figure 2:
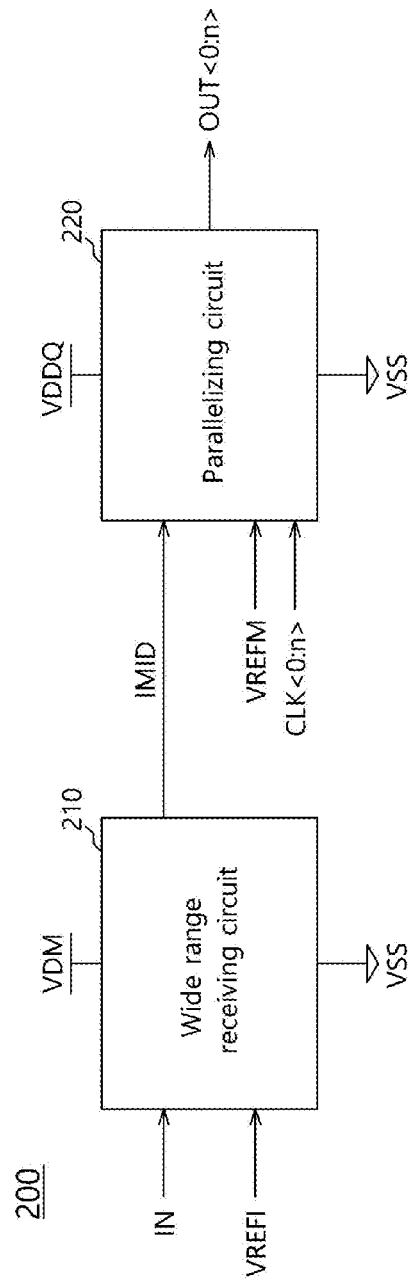
FIG. 2 is a diagram illustrating an example of a receiving circuit in accordance with an embodiment.

FIG. 2 is a diagram illustrating an example of a receiving circuit 200 in accordance with an embodiment. The receiving circuit 200 may amplify in a stepwise fashion an input signal IN swinging within a small voltage range, and generate output signals OUT<0:n>. The receiving circuit 200 may be applied as the receiving circuits 113 and 123 illustrated in FIG. 1.

In FIG. 2, the receiving circuit 200 may include a wide range receiving circuit 210 and a parallelizing circuit 220. The wide range receiving circuit 210 may receive the input signal IN. The input signal IN may be a signal that swings within a first range. The wide range receiving circuit 210 may compare the input signal IN with a first reference voltage VREFI, perform amplification, and generate an intermediate output signal IMID. The input signal IN may be transmitted through a signal transmission line. If the input signal IN is a data signal, it may be transmitted through a signal transmission line such as a data bus. A swing range of the input signal IN may vary according to a standard of communication between semiconductor apparatuses transmitting and receiving the input signal IN. The first reference voltage VREFI may have the middle level of the first range. The wide range receiving circuit 210 may compare the input signal IN and the first reference voltage VREFI and amplify the input signal IN accordingly, and generate the intermediate output signal IMID which swings within a second range. The second range may be wider than the first range. The second range may be between a first amplification voltage VDM and a ground voltage VSS.

The parallelizing circuit 220 may receive the intermediate output signal IMID. The parallelizing circuit 220 may compare the intermediate output signal IMID with a second reference voltage VREFM, perform amplification, and generate the output signals OUT<0:n> which swing within a third range. The third range may be wider than the second range. The parallelizing circuit 220 may compare the intermediate output signal IMID with the second reference voltage VREFM, perform amplification, and generate the output signals OUT<0:n> which swing between a second amplification voltage VDDQ and the ground voltage VSS. The third range may be between the second amplification voltage VDDQ and the ground voltage VSS. The second reference voltage VREFM may have the middle level of the second range. For example, the second reference voltage VREFM may have the middle level of the first amplification voltage VDM. In an embodiment, the second amplification voltage VDDQ may be an external voltage provided from an external device, and the first amplification voltage VDM may be an internal voltage generated using the second amplification voltage VDDQ.

The parallelizing circuit 220 may further receive clock signals CLK<0:n>. The parallelizing circuit 220 may output the output signals OUT<0:n> in synchronization with the clock signals CLK<0:n>. The parallelizing circuit 220 may be a component for converting the input signal IN, which is a serial signal, into parallel form and outputting parallel signals as the output signals OUT<0:n>. The clock signals CLK<0:n> may include a plurality of phase-shifted clock signals which have a predetermined phase difference between them. The parallelizing circuit 220 may amplify the level of the intermediate output signal IMID and output a plurality of output signals in synchronization with, for example, respective rising edges of the plurality of clock signals. The operation of the parallelizing circuit 220 will be described later in detail.

A system including a plurality of semiconductor apparatuses in accordance with an embodiment may operate at a high speed while reducing power consumption. Therefore, since a signal to be transmitted through a signal transmission line or a bus has a small amplitude, a semiconductor apparatus needs a receiving circuit to receive the small-amplitude signal without error. The receiving circuit 200 in accordance with an embodiment may amplify signals in a stepwise fashion by using the first and second amplification voltages VDM and VDDQ. As a consequence, the receiving circuit 200 may precisely generate the output signals OUT<0:n>, which correspond to the input signal IN, based on the small-amplitude input signal IN.

Figure 3:
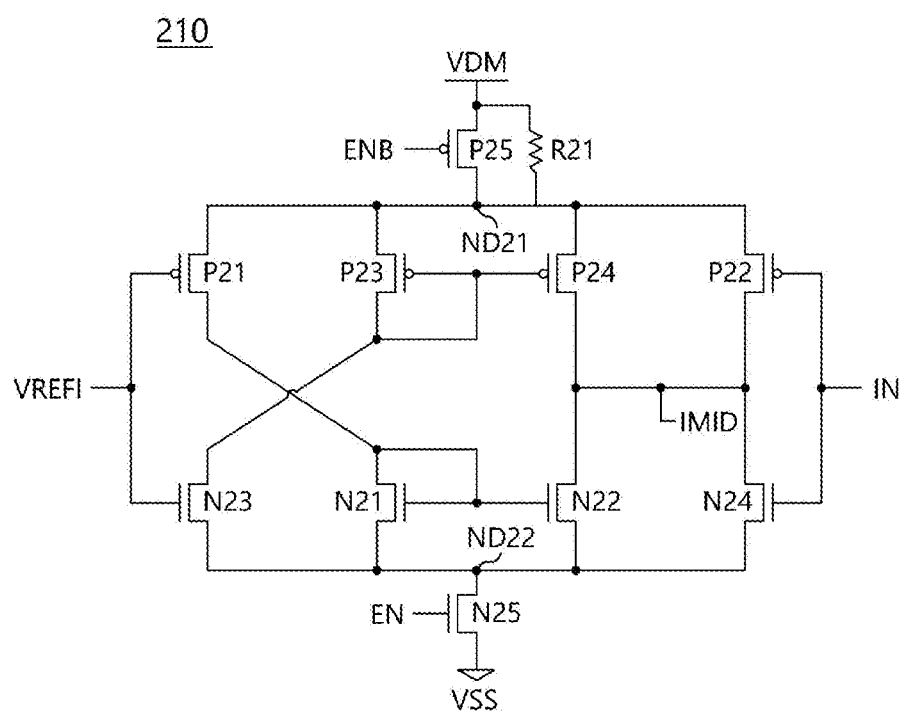
FIG. 3 is a diagram illustrating an example of a wide range receiving circuit illustrated in FIG. 2.

FIG. 3 is a diagram illustrating an example of the wide range receiving circuit 210 illustrated in FIG. 2. In FIG. 3, the wide range receiving circuit 210 may be a type in which a P type amplifier and an N type amplifier are combined. Thus, the wide range receiving circuit 210 may minimize a skew that may be caused by a process variation, and may also minimize a change in a signal value to be inputted or outputted.

The wide range receiving circuit 210 may include first to fifth PMOS transistors P21, P22, P23, P24 and P25, first to fifth NMOS transistors N21, N22, M23, N24 and N25, and a resistor element R21. The first PMOS transistor P21 may have a gate receiving the first reference voltage VREFI and a source coupled to a first node ND21. The second PMOS transistor P22 may have a gate receiving the input signal IN and a source coupled to the first node ND21. The first NMOS transistor N21 and the second NMOS transistor N22 may have gates coupled to each other. The gates of the first and second NMOS transistors N21 and N22 are bias-coupled to the drain of the first NMOS transistor N21. The first NMOS transistor N21 may have the drain coupled to the drain of the first PMOS transistor P21 and a source coupled to a second node ND22. The second NMOS transistor N22 may have a drain coupled to the drain of the second PMOS transistor P22, and a source coupled to the second node ND22.

The third NMOS transistor N23 may have a gate receiving the first reference voltage VREFI and a source coupled to the second node ND22. The fourth NMOS transistor N24 may have a gate receiving the input signal IN and a source coupled to the second node ND22. The gates of the third PMOS transistor P23 and the fourth PMOS transistor P24 may be coupled to each other. The gates of the third and fourth PMOS transistors P23 and P24 are bias-coupled to the drain of the third PMOS transistor P23. The third PMOS transistor P23 may have the drain coupled to the drain of the third NMOS transistor N23, and a source coupled to the first node ND21. The fourth PMOS transistor P24 may have a drain coupled to the drain of the fourth NMOS transistor N24, and a source coupled to the first node ND21.

The fifth NMOS transistor N25 may have a gate receiving an enable signal EN, a drain coupled to the second node ND22, and a source coupled to the ground voltage VSS. The fifth PMOS transistor P25 may have a gate receiving an inverted signal ENB of the enable signal EN, a drain coupled to the first node ND21, and a source receiving the first amplification voltage VDM. The enable signal EN may be a signal that may be generated from an internal circuit of a semiconductor apparatus including the receiving circuit 200 to operate the receiving circuit 200. The resistor element R21 may bypass the fifth PMOS transistor P25 and apply the first amplification voltage VDM to the first node ND21.

If the enable signal EN is enabled, the fifth NMOS transistor N25 may couple the second node ND22 to the ground voltage VSS, and the fifth PMOS transistor P25 may couple the first node ND21 to the first amplification voltage VDM. The first and second NMOS transistors N21 and N22 and the third and fourth PMOS transistors P23 and P24 may be interconnected to form a current mirror, and the first and second PMOS transistors P21 and P22 and the third and fourth NMOS transistors N23 and N24 may compare the first reference voltage VREFI and the input signal IN and amplify the input signal IN accordingly. The intermediate output signal IMID may be outputted from a node where the drains of the second PMOS transistor P22 and the fourth NMOS transistor N24 are coupled. The wide range receiving circuit 210 may generate the intermediate output signal IMID amplified to the level of the first amplification voltage VDM in the case where the input signal IN having a level lower than the first reference voltage VREFI is received, and generate the intermediate output signal IMID amplified to the level of the ground voltage VSS in the case where the input signal IN having a level higher than the first reference voltage VREFI is received.

Figure 4:
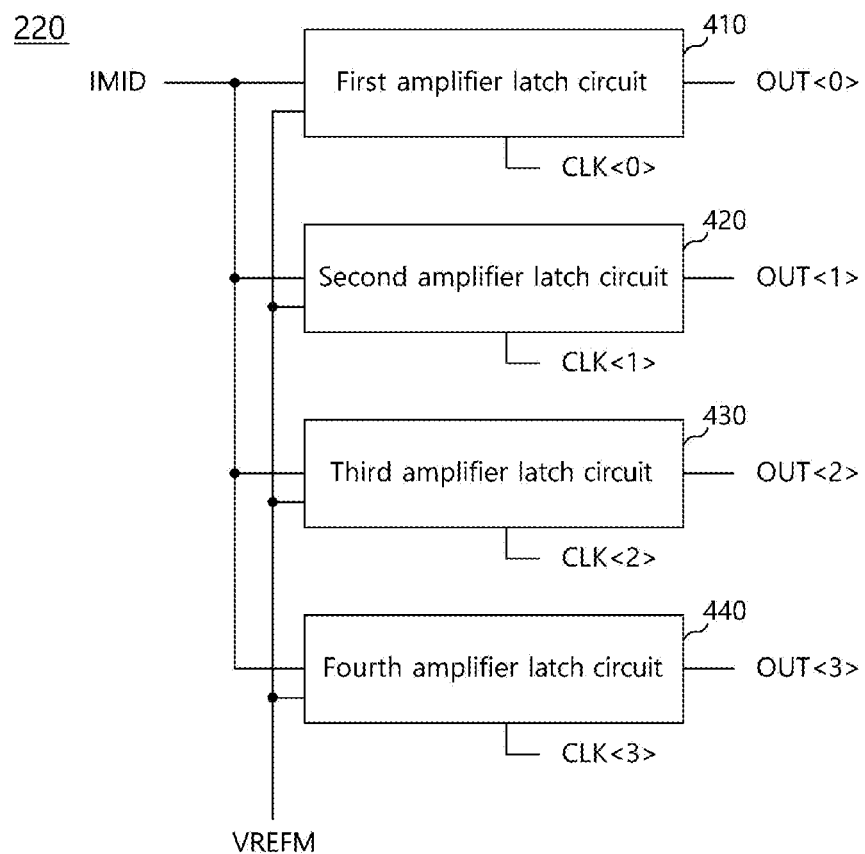
FIG. 4 is a diagram illustrating an example of a parallelizing circuit illustrated in FIG. 2.

FIG. 4 is a diagram illustrating an example of the parallelizing circuit 220 illustrated in FIG. 2. In FIG. 4, the parallelizing circuit 220 may include first to fourth amplifier latch circuits 410, 420, 430 and 440. The first amplifier latch circuit 410 may receive the intermediate output signal IMID, the second reference voltage VREFM and a first clock signal CLK<0>, and generate a first output signal OUT<0>. The first amplifier latch circuit 410 may compare the intermediate output signal IMID with the second reference voltage VREFM, perform amplification, and output the first output signal OUT<0> in synchronization with the first clock signal CLK<0>. The second amplifier latch circuit 420 may receive the intermediate output signal IMID, the second reference voltage VREFM and a second clock signal CLK<1>, and generate a second output signal OUT<1>. The second amplifier latch circuit 420 may compare the intermediate output signal IMID with the second reference voltage VREFM, perform amplification, and output the second output signal OUT<1> in synchronization with the second clock signal CLK<1>. The third amplifier latch circuit 430 may receive the intermediate output signal IMID, the second reference voltage VREFM and a third clock signal CLK<2>, and generate a third output signal OUT<2>. The third amplifier latch circuit 430 may compare the intermediate output signal IMID with the second reference voltage VREFM, perform amplification, and output the third output signal OUT<2> in synchronization with the third clock signal CLK<2>. The fourth amplifier latch circuit 440 may receive the intermediate output signal IMID, the second reference voltage VREFM and a fourth clock signal CLK<3>, and generate a fourth output signal OUT<3>. The fourth amplifier latch circuit 440 may compare the intermediate output signal IMID with the second reference voltage VREFM, perform amplification, and output the fourth output signal OUT<3> in synchronization with the fourth clock signal CLK<3>.

The first to fourth clock signals CLK<0>, CLK<1>, CLK<2> and CLK<3> may be generated by dividing the frequency of a clock signal such as a data strobe signal. Alternatively, the first to fourth clock signals CLK<0>, CLK<1>, CLK<2> and CLK<3> may be generated by shifting the phase of the clock signal such as the data strobe signal. The data strobe signal may be a clock signal that is synchronized with data to notify a timing at which the data is received. The first to fourth clock signals CLK<0>, CLK<1>, CLK<2> and CLK<3> may have a predetermined phase difference. For example, the first to fourth clock signals CLK<0>, CLK<1>, CLK<2> and CLK<3> may have a phase difference of 90 degrees. The first to fourth amplifier latch circuits 410, 420, 430 and 440 may output in parallel the intermediate output signal IMID inputted in series, as the four output signals OUT<0>, OUT<1>, OUT<2> and OUT<3>. The parallelizing circuit 220 may have a various number of amplifier latch circuits according to an application. For example, in order to output in parallel eight output signals, the parallelizing circuit 220 may include eight amplifier latch circuits which receive eight clock signals. The eight clock signals may have a phase difference of, for example, 45 degrees.

Figure 5:
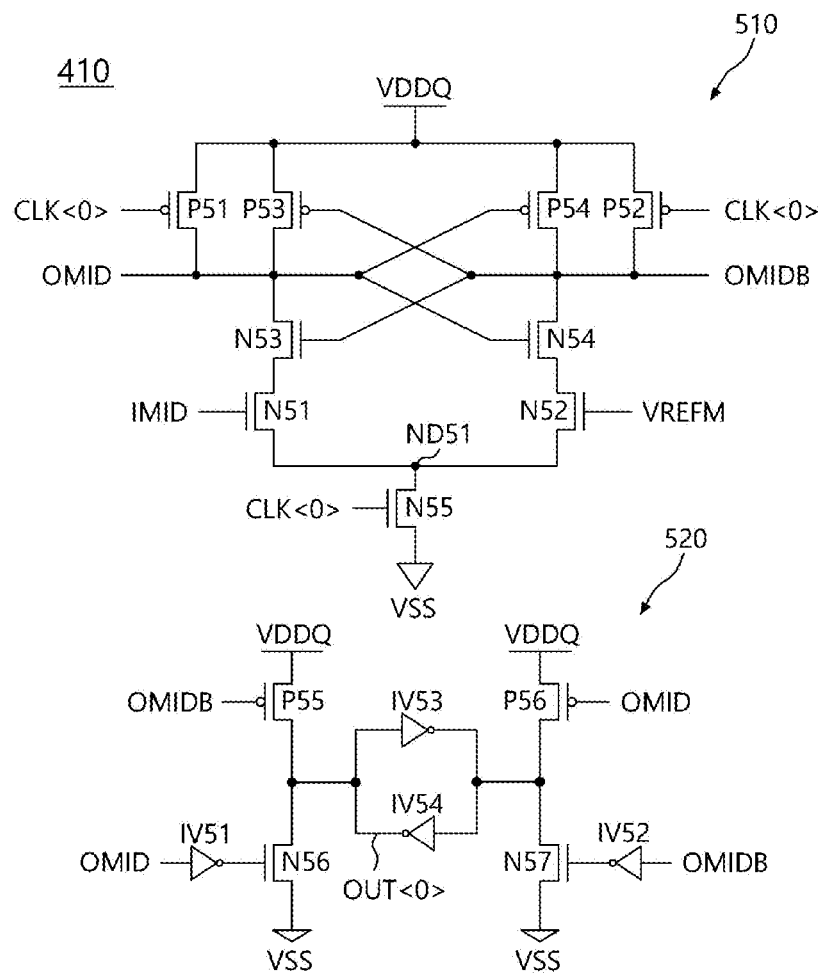
FIG. 5 is a diagram illustrating an example of a first amplifier latch circuit illustrated in FIG. 4.

FIG. 5 is a diagram illustrating an example of the first amplifier latch circuit 410 illustrated in FIG. 4. In FIG. 5, the first amplifier latch circuit 410 may include an amplifying section 510 and a level converting section 520. The second to fourth amplifier latch circuits 420, 430 and 440 illustrated in FIG. 4 may have the same or substantially the same configuration as the first amplifier latch circuit 410 illustrated in FIG. 5 except signals inputted thereto and outputted therefrom. The amplifying section 510 may include first to fourth PMOS transistors P51, P52, P53 and P54 and first to fifth NMOS transistors N51, N52, N53, N54 and N55. The first PMOS transistor P51 may have a gate receiving the first clock signal CLK<0> and a source receiving the second amplification voltage VDDQ. The second PMOS transistor P52 may have a gate receiving the first clock signal CLK<0> and a source receiving the second amplification voltage VDDQ. The first NMOS transistor N51 may have a gate receiving the intermediate output signal IMID and a source coupled to a first node ND51. The second NMOS transistor N52 may have a gate receiving the second reference voltage VREFM and a source coupled with the first node ND51. The third PMOS transistor P53 may have a source receiving the second amplification voltage VDDQ, a gate coupled to the drain of the fourth PMOS transistor P54 and the gate of the third NMOS transistor N53, and a drain coupled to the drain of the first PMOS transistor P51 and the gate of the fourth NMOS transistor N54. The fourth PMOS transistor P54 may have a source receiving the second amplification voltage VDDQ, a gate coupled to the drain of the third PMOS transistor P53 and the gate of the fourth NMOS transistor N54, and a drain coupled to the gate of the third NMOS transistor N53 and the drain of the second PMOS transistor P52. The third NMOS transistor N53 may have a drain coupled to the drain of the third PMOS transistor P53, the gate coupled to the gate of the third PMOS transistor P53 and the drain of the fourth PMOS transistor P54, and a source coupled to the drain of the first NMOS transistor N51. The fourth NMOS transistor N54 may have a drain coupled to the drain of the fourth PMOS transistor P54, the gate coupled to the gate of the fourth PMOS transistor P54 and the drain of the third PMOS transistor P53, and a source coupled to the drain of the second NMOS transistor N52. The fifth NMOS transistor N55 may have a gate receiving the first clock signal CLK<0>, a drain coupled to the first node ND51, and a source coupled to the ground voltage VSS. A first amplified signal OMID may be generated from the drains of the first and third PMOS transistors P51 and P53, and a second amplified signal OMIDB may be generated from the drains of the second and fourth PMOS transistors P52 and P54. The second amplified signal OMIDB may be a complementary signal of the first amplified signal OMID.

The amplifying section 510 may be precharged when the first clock signal CLK<0> is at a logic low level. The amplifying section 510 may couple the first node ND51 to the ground voltage VSS when the first clock signal CLK<0> is at a logic high level. Therefore, the amplifying section 510 may compare the intermediate output signal IMID and the second reference voltage VREFM and amplify the intermediate output signal IMID accordingly, and generate the first amplified signal OMID and the second amplified signal OMIDB. For example, when the intermediate output signal IMID has a level higher than the second reference voltage VREFM, the amplifying section 510 may generate the first amplified signal OMID amplified to the level of the ground voltage VSS. When the intermediate output signal IMID has a level lower than the second reference voltage VREFM, the amplifying section 510 may generate the first amplified signal OMID amplified to the level of the second amplification voltage VDDQ.

The level converting section 520 may convert the first and second amplified signals OMID and OMIDB, which are generated as pulse signals, into level signals, and generate the first output signal OUT<0>. The level converting section 520 may include first to fourth inverters IV51, IV52, IV53 and IV54, fifth and sixth PMOS transistors P55 and P56, and sixth and seventh NMOS transistors N56 and N57. The first inverter IV51 may invert the first amplified signal OMID and output a resultant signal. The second inverter IV52 may invert the second amplified signal OMIDB and output a resultant signal. The fifth PMOS transistor P55 may have a gate receiving the second amplified signal OMIDB and a source receiving the second amplification voltage VDDQ. The sixth PMOS transistor P56 may have a gate receiving the first amplified signal OMID and a source receiving the second amplification voltage VDDQ. The sixth NMOS transistor N56 may have a gate receiving the output of the first inverter IV51, a drain coupled to the drain of the fifth PMOS transistor P55, and a source coupled to the ground voltage VSS. The seventh NMOS transistor N57 may have a gate receiving the output of the second inverter IV52, a drain coupled to the drain of the sixth PMOS transistor P56, and a source coupled to the ground voltage VSS. The third inverter IV53 may have an input terminal coupled to the drains of the fifth PMOS transistor P55 and the sixth NMOS transistor N56, and an output terminal coupled to the drains of the sixth PMOS transistor P56 and the seventh NMOS transistor N57. The fourth inverter IV54 may have an input terminal coupled to the output terminal of the third inverter IV53, and an output terminal coupled to the input terminal of the third inverter IV53. The first output signal OUT<0> may be outputted from the output terminal of the fourth inverter IV54. The level converting section 520 may generate the first output signal OUT<0> which has the level of the second amplification voltage VDDQ, when the first amplified signal OMID is at a logic high level. Also, the level converting section 520 may generate the first output signal OUT<0> which has the level of the ground voltage VSS, when the first amplified signal OMID is at a logic low level.

Figure 6:
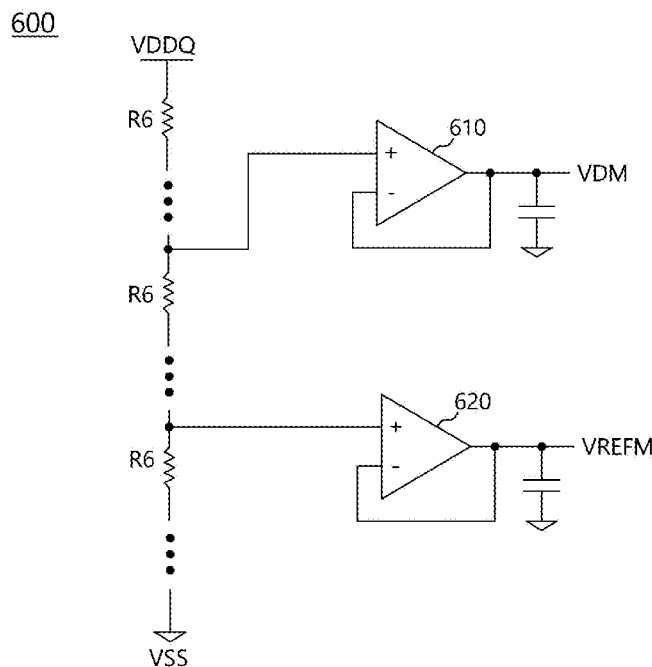
FIG. 6 is a diagram illustrating an example of an internal voltage generating circuit in accordance with an embodiment.

The receiving circuit 200 in accordance with an embodiment may further include an internal voltage generating circuit. FIG. 6 is a diagram illustrating an example of an internal voltage generating circuit 600 in accordance with an embodiment. The internal voltage generating circuit 600 may generate the first amplification voltage VDM and the second reference voltage VREFM from the second amplification voltage VDDQ. The internal voltage generating circuit 600 may include a plurality of resistors R6 coupled in series between the second amplification voltage VDDQ and the ground voltage VSS, a first comparator 610, and a second comparator 620. The first comparator 610 may be coupled to a resistor R6 that is $2k^{th}$ resistor from the ground voltage VSS, and generate the first amplification voltage VDM which has a voltage level obtained by voltage dividing the second amplification voltage VDDQ. Further, the second comparator 620 may be coupled a resistor R6 that is $k^{th}$ resistor from the ground voltage VSS, and generate the second reference voltage VREFM which has the middle level of the first amplification voltage VDM.

Figure 7:
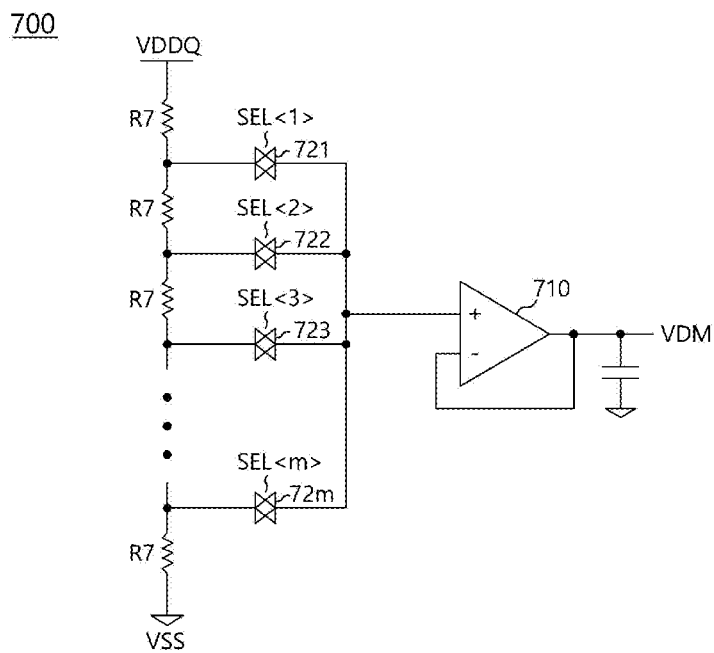
FIG. 7 is a diagram illustrating an example of an internal voltage generating circuit in accordance with an embodiment.

FIG. 7 is a diagram illustrating an example of an internal voltage generating circuit 700 in accordance with an embodiment. As described above, the swing width of the input signal IN may be adjusted according to an application. Therefore, the internal voltage generating circuit 700 may adjust the level of the first amplification voltage VDM and the level of the second reference voltage VREFM according to a swing width of the input signal IN. That is to say, the internal voltage generating circuit 700 may adjust the second range according to the first range. The internal voltage generating circuit 700 may include a plurality of resistors R7, which are coupled in series between the second amplification voltage VDDQ and the ground voltage VSS, and a first comparator 710. The internal voltage generating circuit 700 may include a plurality of switches 721, 722, 723, . . . , and 72m which respectively couple the plurality of resistors R7 and the first comparator 710 in response to select signals SEL<1:m>. The select signals SEL<1:m> may include information on the first range. The select signals SEL<1:m> may include information on the swing width of the input signal IN. A certain select signal, among the select signals SEL<1:m>, may be enabled according to the information on the swing width of the input signal IN, and a voltage generated by voltage dividing the second amplification voltage VDDQ may be provided to the first comparator 710 through a switch that may be turned on according to the specific select signal. Accordingly, the first comparator 710 may generate the first amplification voltage VDM selected between the divided voltage level according to the select signals SEL<1:m>. While not illustrated, similarly to FIG. 6, the second reference voltage VREFM may be generated by voltage dividing the first amplification voltage VDM, and may be generated from a divided voltage outputted from a switch that receives another select signal.

Figure 8:
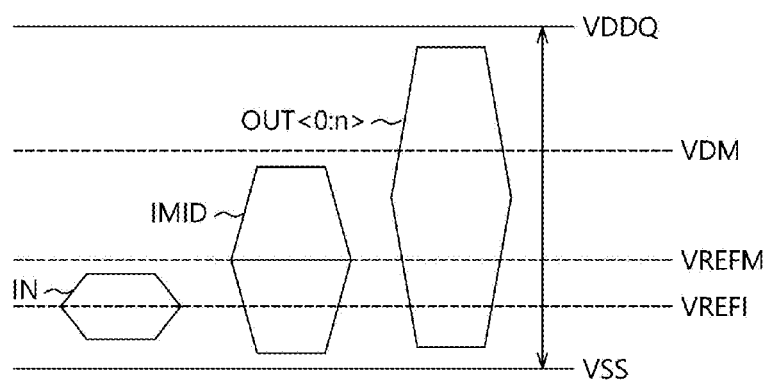
FIG. 8 is a diagram illustrating an example of the operation of the receiving circuit in accordance with an embodiment.

FIG. 8 is a diagram illustrating an example of the operation of the receiving circuit 200 in accordance with an embodiment. The input signal IN may be a signal that swings within the first range having the first reference voltage VREFI as a middle level. The wide range receiving circuit 210 may compare the input signal IN and the first reference voltage VREFI, and generate the intermediate output signal IMID which is amplified to the first amplification voltage VDM and the ground voltage VSS. The intermediate output signal IMID may swing within the second range having the second reference voltage VREFM as a middle level. The parallelizing circuit 220 may compare the intermediate output signal IMID, which swings within the second range, with the second reference voltage VREFM, and generate the output signals OUT<0:n> which are amplified to the second amplification voltage VDDQ and the ground voltage VSS. The output signals OUT<0:n> may swing within the third range which ranges from the ground voltage VSS to the second amplification voltage VDDQ. The receiving circuit 200 may amplify the input signal IN in a stepwise fashion by using the first and second amplification voltages VDM and VDDQ, and generate the output signals OUT<0:n>. Thus, even if the input signal IN swings within a small range at a low level, the output signals OUT<0:n> corresponding to the input signal IN may be precisely generated.

Figure 9:
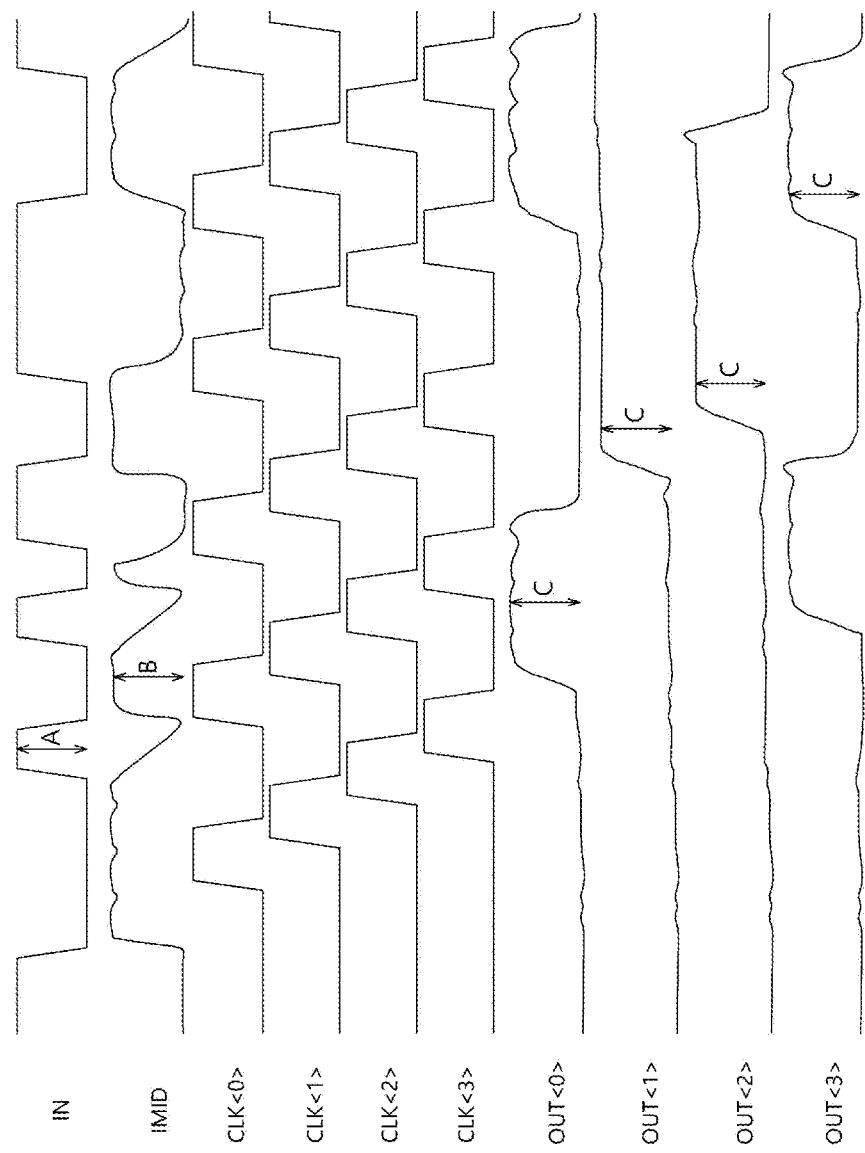
FIG. 9 is a diagram illustrating an example of the operation of the receiving circuit in accordance with an embodiment.

FIG. 9 is a diagram to illustrating an example of the operation of the receiving circuit 200 in accordance with an embodiment. The operation of the receiving circuit 200 in accordance with an embodiment will be described below with reference to FIGS. 1 to 9. If the input signal IN which swings within a first range A is inputted, the wide range receiving circuit 210 may compare the input signal IN with the first reference voltage VREFI, and generate the intermediate output signal IMID which swings within a second range B. The parallelizing circuit 220 may compare the intermediate output signal IMID with the second reference voltage VREFM, and generate the output signals OUT<0:n> which swing within a third range C. The second range B, which is the swing width or amplitude of the intermediate output signal IMID, may be wider than the first range A, which is the swing width or amplitude of the input signal IN, and the third range C, which is the swing width or amplitude of the output signals OUT<0:n>, may be wider than the second range B, which is the swing width or amplitude of the intermediate output signal IMID.

Since the intermediate output signal IMID has a high level at a first rising edge of the first clock signal CLK<0>, the first amplifier latch circuit 410 may generate the first output signal OUT<0> having the level of the ground voltage VSS. Since the intermediate output signal IMID is level-shifted from the high level to a low level at a second rising edge of the first clock signal CLK<0>, the first amplifier latch circuit 410 may change the first output signal OUT<0> to the level of the second amplification voltage VDDQ. Since the intermediate output signal IMID has the high level at a third rising edge of the first clock signal CLK<0>, the first amplifier latch circuit 410 may change the first output signal OUT<0> to the level of the ground voltage VSS. Since the intermediate output signal IMID has the high level at a fourth rising edge of the first clock signal CLK<0>, the first amplifier latch circuit 410 may retain the level of the first output signal OUT<0>. Since the intermediate output signal IMID has the low level at a fifth rising edge of the first clock signal CLK<0>, the first amplifier latch circuit 410 may change the first output signal OUT<0> to the level of the second amplification voltage VDDQ.

Since the intermediate output signal IMID has the high level at first and second rising edges of the second clock signal CLK<1>, the second amplifier latch circuit 420 may generate the second output signal OUT<1> which has the level of the ground voltage VSS. Since the intermediate output signal IMID has the low level at a third rising edge of the second clock signal CLK<1>, the second amplifier latch circuit 420 may change the second output signal OUT<1> to the level of the second amplification voltage VDDQ. Since the intermediate output signal IMID has the low level at fourth and fifth rising edges of the second clock signal CLK<1>, the second amplifier latch circuit 420 may retain the level of the second output signal OUT<1> as it is.

Since the intermediate output signal IMID has the high level at first and second rising edges of the third clock signal CLK<2>, the third amplifier latch circuit 430 may generate the third output signal OUT<2> which has the level of the ground voltage VSS. Since the intermediate output signal IMID has the low level at a third rising edge of the third clock signal CLK<2>, the third amplifier latch circuit 430 may change the third output signal OUT<2> to the level of the second amplification voltage VDDQ. Since the intermediate output signal IMID has the low level at a fourth rising edge of the third clock signal CLK<2>, the third amplifier latch circuit 430 may retain the level of the third output signal OUT<2>. Since the intermediate output signal IMID has the high level at a fifth rising edge of the third clock signal CLK<2>, the third amplifier latch circuit 430 may change the level of the third output signal OUT<2> to the level of the ground voltage VSS.

Since the intermediate output signal IMID has the high level at a first rising edge of the fourth clock signal CLK<3>, the fourth amplifier latch circuit 440 may generate the fourth output signal OUT<3> which has the level of the ground voltage VSS. Since the intermediate output signal IMID has the low level at a second rising edge of the fourth clock signal CLK<3>, the fourth amplifier latch circuit 440 may change the fourth output signal OUT<3> to the level of the second amplification voltage VDDQ. Since the intermediate output signal IMID has the high level at a third rising edge of the fourth clock signal CLK<3>, the fourth amplifier latch circuit 440 may change the fourth output signal OUT<3> to the level of the ground voltage VSS. Since the intermediate output signal IMID has the low level at a fourth rising edge of the fourth clock signal CLK<3>, the fourth amplifier latch circuit 440 may change the fourth output signal OUT<3> to the level of the second amplification voltage VDDQ. Since the intermediate output signal IMID has the high level at a fifth rising edge of the fourth clock signal CLK<3>, the fourth amplifier latch circuit 440 may change the fourth output signal OUT<3> to the level of the ground voltage VSS.

As described above, the input signal IN which is inputted in series may be amplified to voltage levels and ranges, which are increased in a stepwise fashion, through the wide range receiving circuit 210 and the parallelizing circuit 220, and may be converted into the output signals OUT<0:n> which are outputted in parallel by the first to fourth amplifier latch circuits 410, 420, 430 and 440. The levels of the first to fourth output signals OUT<0:4> may have levels corresponding to the levels of the input signal IN and the intermediate output signal IMID at the rising edges of the first to fourth clock signals CLK<0:4>.

Figure 10:
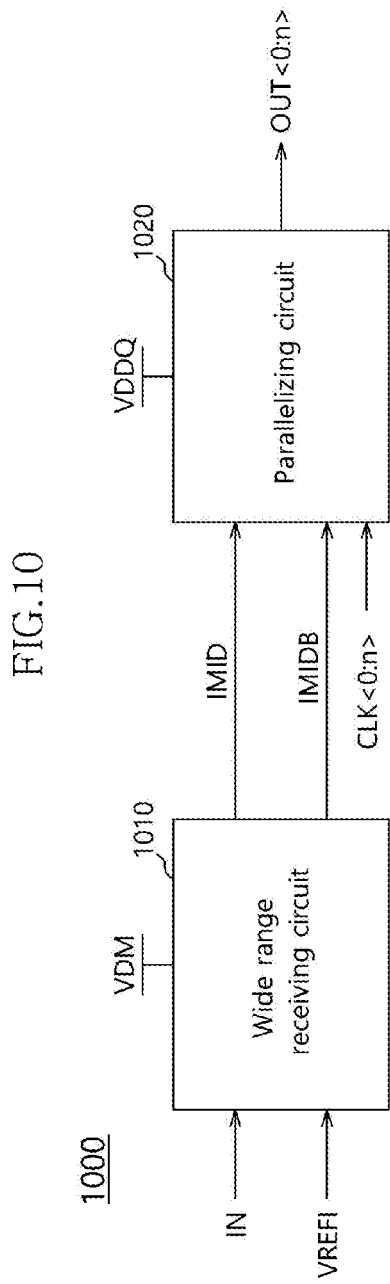
FIG. 10 is a diagram illustrating an example of a receiving circuit in accordance with an embodiment.

FIG. 10 is a diagram illustrating an example of a receiving circuit 1000 in accordance with an embodiment. In FIG. 10, the receiving circuit 1000 may include a wide range differential receiving circuit 1010 and a parallelizing circuit 1020. The wide range differential receiving circuit 1010 may receive the input signal IN. The wide range differential receiving circuit 1010 may compare the input signal IN with the first reference voltage VREFI, perform amplification, and generate first and second intermediate output signals IMID and IMIDB. The second intermediate output signal IMIDB may be a complementary signal of the first intermediate output signal IMID. The wide range differential receiving circuit 1010 may amplify the input signal IN by using the first amplification voltage VDM. The wide range differential receiving circuit 1010 may perform the same or substantially the same function as the wide range receiving circuit 210 illustrated in FIG. 2 except that the wide range differential receiving circuit 1010 generates the first and second intermediate output signals IMID and IMIDB as differential signals. The wide range differential receiving circuit 1010 may provide the first and second intermediate output signals IMID and IMIDB to the parallelizing circuit 1020, and may thereby obviate the need for use of the second reference voltage VREFM at the parallelizing circuit 1020.

The parallelizing circuit 1020 may receive the first and second intermediate output signals IMID and IMIDB. The parallelizing circuit 1020 may compare and amplify the first and second intermediate output signals IMID and IMIDB, and generate the output signals OUT<0:n>. The parallelizing circuit 1020 may output the output signals OUT<0:n> in synchronization with the clock signals CLK<0:n>. The parallelizing circuit 1020 may amplify the first and second intermediate output signals IMID and IMIDB by using the second amplification voltage VDDQ. The parallelizing circuit 1020 may perform the same or substantially the same function as the parallelizing circuit 220 illustrated in FIGS. 2 and 4 except that the parallelizing circuit 1020 receives the second intermediate output signal IMIDB instead of the second reference voltage VREFM.

Figure 11:
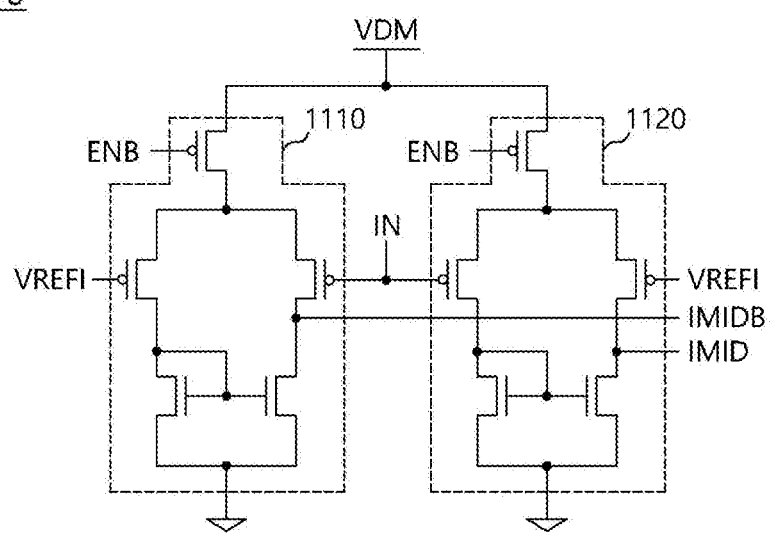
FIG. 11 is a diagram illustrating an example of a wide range differential receiving circuit illustrated in FIG. 10.

FIG. 11 is a diagram illustrating an example of a wide range differential receiving circuit 1010 illustrated in FIG. 10. In FIG. 11, the wide range differential receiving circuit 1010 may include first and second amplifying circuits 1110 and 1120. The first amplifying circuit 1110 may compare the input signal IN and the first reference voltage VREFI in response to an inverted signal ENB of an enable signal EN when the enable signal EN is enabled, and generate the first intermediate output signal IMID which swings between the second amplification voltage VDDQ and the ground voltage VSS. The second amplifying circuit 1120 may compare the input signal IN and the first reference voltage VREFI in response to the inverted signal ENB of the enable signal EN when the enable signal EN is enabled, and generate the second intermediate output signal IMIDB which swings between the second amplification voltage VDDQ and the ground voltage VSS. Since the first and second amplifying circuits 1110 and 1120 receive the input signal IN and the first reference voltage VREFI through opposite nodes to one another, the first and second amplifying circuits 1110 and 1120 may generate the first and second intermediate output signals IMID and IMIDB which have opposite levels.

While various embodiments have been described above, it will be understood to those skilled in the art that the embodiments described are examples only. Accordingly, the receiving circuit, and the semiconductor apparatus and the system using the same described herein should not be limited based on the described embodiments.

What is claimed is:

1. A receiving circuit comprising:
    a wide range receiving circuit configured to compare an input signal, which swings within a first range, with a first reference voltage and amplify the input signal accordingly, and generate an intermediate output signal which swings within a second range wider than the first range; and
    a parallelizing circuit configured to compare the intermediate output signal with a second reference voltage and amplify the intermediate output signal accordingly, and generate output signals which swing within a third range wider than the second range.

2. The receiving circuit according to claim 1, wherein the first reference voltage has a middle level of the first range.

3. The receiving circuit according to claim 1, wherein the second reference voltage has a middle level of the second range.

4. The receiving circuit according to claim 1, wherein the parallelizing circuit outputs the output signals in synchronization with clock signals.

5. The receiving circuit according to claim 1, wherein the second range is adjusted according to a change in the first range.

6. The receiving circuit according to claim 5, further comprising an internal voltage generating circuit configured to receive a select signal which has information on the first range, and generate a first amplification voltage,
    wherein the wide range receiving circuit amplifies the input signal to a range from a ground voltage to the first amplification voltage.

7. The receiving circuit according to claim 5,
    wherein the parallelizing circuit amplifies the intermediate output signal between a second amplification voltage and the ground voltage, and
    wherein the second amplification voltage has a level higher than the first amplification voltage.

8. A receiving circuit comprising:
    a wide range differential receiving circuit configured to compare an input signal, which swings within a first range, with a first reference voltage and amplify the input signal accordingly, and generate a first intermediate output signal and a second intermediate output signal which swing within a second range wider than the first range; and
    a parallelizing circuit configured to compare and amplify the first and second intermediate output signals, and generate output signals which swing within a third range wider than the second range.

9. The receiving circuit according to claim 8, wherein the first reference voltage has a middle level of the first range.

10. The receiving circuit according to claim 8, wherein the parallelizing circuit outputs the output signals in synchronization with clock signals.

11. The receiving circuit according to claim 8, wherein the second range is adjusted according to the first range.

12. The receiving circuit according to claim 11, further comprising an internal voltage generating circuit configured to receive a select signal which has information on the first range, and generate a first amplification voltage, wherein the wide range differential receiving circuit amplifies the input signal to a range from a ground voltage to the first amplification voltage.

13. The receiving circuit according to claim 12, wherein the parallelizing circuit amplifies the first and second intermediate output signals to a range from the ground voltage to a second amplification voltage, and wherein the second amplification voltage has a level higher than the first amplification voltage.

14. A system comprising:
a first semiconductor apparatus configured to transmit data signal through a data bus; and
a second semiconductor apparatus including a receiving circuit which receives the data signal,
the receiving circuit comprising:
a wide range receiving circuit configured to compare the data signal with a first reference voltage and amplify the data signal accordingly, and generate first and second intermediate output signals which swing between a first amplification voltage and a ground voltage; and
a parallelizing circuit configured to compare and amplify the first and second intermediate output signals, generate output signals which swing between a second amplification voltage having a level higher than the first amplification voltage and the ground voltage, and output the output signals in synchronization with a data strobe signal.

15. The system according to claim 14, wherein the first reference voltage has a middle level of a swing width of the data signal.

16. The system according to claim 14, wherein the second reference voltage has a middle level of the first amplification voltage.

17. The system according to claim 14,
wherein the parallelizing circuit comprises a plurality of amplifier latch circuits, and
wherein the plurality of amplifier latch circuits output the output signals in synchronization with a plurality of clock signals which are generated from the data strobe signal and have a phase difference of 90 degrees.

18. The system according to claim 14, wherein a level of the first amplification voltage is adjusted according to the swing width of the data signal.

19. The system according to claim 18, further comprising:
an internal voltage generating circuit configured to receive a select signal which has information on the swing width of the data signal, and generate the first amplification voltage.

* * * * *